United States Patent

Sanada

(10) Patent No.: US 6,883,115 B2
(45) Date of Patent: Apr. 19, 2005

(54) LSI DIAGNOSTIC SYSTEM AND METHOD OF DIAGNOSING LSI

(75) Inventor: Masaru Sanada, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 376 days.

(21) Appl. No.: 10/236,951

(22) Filed: Sep. 9, 2002

(65) Prior Publication Data

US 2003/0057991 A1 Mar. 27, 2003

(30) Foreign Application Priority Data

Sep. 10, 2001 (JP) .................................. 2001-273546

(51) Int. Cl.$^7$ .............................................. G01R 31/28
(52) U.S. Cl. ........................................ 714/26; 714/30
(58) Field of Search .............................. 714/703, 726, 714/742, 735, 733, 734, 30, 738, 31, 48, 46

(56) References Cited

U.S. PATENT DOCUMENTS

| | | | | |
|---|---|---|---|---|
| 5,663,967 A | * | 9/1997 | Lindberg et al. ............. | 714/737 |
| 5,850,404 A | * | 12/1998 | Sanada ........................ | 714/745 |
| 5,944,847 A | * | 8/1999 | Sanada ........................ | 714/741 |
| 6,684,170 B1 | * | 1/2004 | Sakaguchi .................... | 702/76 |

FOREIGN PATENT DOCUMENTS

| JP | A 61-155874 | 7/1986 |
|---|---|---|
| JP | A 62-168240 | 7/1987 |
| JP | A 63-169580 | 7/1988 |
| JP | A 2-136936 | 5/1990 |
| JP | A 4-30227 | 2/1992 |
| JP | A 5-72272 | 3/1993 |
| JP | A 5-180908 | 7/1993 |
| JP | A 7-104033 | 4/1995 |
| JP | B2 2727941 | 12/1997 |
| JP | A 11-101859 | 4/1999 |
| JP | A 11-133119 | 5/1999 |
| JP | A 11-174126 | 7/1999 |
| JP | B2 3104739 | 9/2000 |

\* cited by examiner

*Primary Examiner*—Phung My Chung
(74) *Attorney, Agent, or Firm*—Young & Thompson

(57) ABSTRACT

A diagnostic system for finding failures in an integrated circuit includes a scan-chain circuit which is comprised of a plurality of flip-flop circuits electrically connected in series to one another and outputs logic data stored in the flip-flop circuits on receipt of a control signal. The diagnostic system includes (a) a first identifier which identifies a circuit group which is suspected to have failure therein, among circuit groups surrounded by the scan-chain circuit, (b) a first extractor which extracts logic data of an input terminal of the circuit group having been identified by the first identifier, (c) a second extractor which extracts logic data to be input into each of fundamental logic circuits constituting the circuit group, and (d) a second identifier which identifies a fundamental logic circuit suspected to have failure therein by comparing the logic data having been extracted by the second extractor, to one another.

17 Claims, 11 Drawing Sheets

TVN : TEST VECTOR NUMBER
Pad : OUTPUT TERMINAL

| TVN | Clock | Reset | Set | Q | Q̄ |
|---|---|---|---|---|---|
| 1 | x | 1 | 1 | 1 | 1 |
| 2 | x | 1 | 0 | 0 | 0 |
| 3 | x | 0 | 1 | 1 | 0 |
| ⋮ | | ⋮ | | ⋮ | |
| n | 0 | 0 | 0 | 0 | 1 |
| n+2 | 1 | 0 | 0 | 1 | 0 |
| n+3 | 0 | 0 | 0 | 1 | 0 |
| n+4 | 1 | 0 | 0 | 0 | 1 |
| n+5 | 0 | 0 | 0 | 0 | 1 |
| n+6 | 1 | 0 | 0 | 1 | 0 |
| n+7 | 0 | 0 | 0 | 1 | 0 |

FIG.10A

| TVN | 1 2 3 4 5 |   |
|-----|-----------|---|
| 1   | 0 0 1 1 1 |   |
| ⋮   | ⋮         |   |
| m   | 0 0 1 0 1 |   |
| m+1 | 0 0 1 0 0 |   |
| m+2 | 1 1 1 0 0 | LOGIC ERROR |
| m+3 | 1 1 0 0 0 |   |
| ⋮   | ⋮         |   |
| n   | 1 1 1 0 0 | LOGIC ERROR |
| ⋮   | ⋮         |   |

FIG.10B

| TVN | 1 2 3 4 5 |   |
|-----|-----------|---|
| 1   | 0 0 1 1 1 |   |
| ⋮   | ⋮         |   |
| m   | 0 0 1 0 1 |   |
| m+1 | 0 0 1 0 0 |   |
| m+2 | 1 1 1 0 0 | LOGIC ERROR |
| m+3 | 1 1 0 0 0 |   |
| ⋮   | ⋮         |   |
| n   | 1 1 1 0 0 | NORMAL LOGIC |
| ⋮   | ⋮         |   |

LSI DIAGNOSTIC SYSTEM AND METHOD OF DIAGNOSING LSI

BACKGROUND OF THE INVENTION

1. Field of the Invention

The invention relates to a system for diagnosing an integrated circuit such as LSI and a method of doing the same, and more particularly to such a system and a method for identifying a failure in an integrated circuit.

2. Description of the Related Art

A failure generated in a CMOS logic circuit has been conventionally identified by virtue of a test using output logic data. Specifically, in the test, a test vector is input into LSI to be tested, through its input terminal, and then, there is obtained output logic data transmitted from LSI through its output terminal. If the thus obtained output logic data is not identical with expectation, a failure site would be identified by means of the number of the test vector, the output logic data and the number of the input and output terminals.

The above-mentioned test is grouped into two groups. The first group is called "back-trace process", in which logic is traced in an opposite direction, that is, traced back from an output terminal to an input terminal to thereby identify a failure site. The second group is called "failure dictionary process", in which an output expected by logic simulation as transmitted from LSI in which a failure is in advance defined is checked as to whether it is identical with an output transmitted from LSI actually having a failure therein, and thereby, a failure site is identified in accordance with a result of checking.

FIG. 1 shows how the back-trace process is carried out.

In the back-trace process, as illustrated in FIG. 1, implicative operation is repeatedly carried out in a direction from an output terminal (Pad) to an input terminal for developing logics, to thereby identify a failure site. Herein, the implicative operation means an operation for pursuing unknown logic of a fundamental logic circuit, based on input and output logics of an arbitrary fundamental logic circuit. The implicative operation is grouped into a forward implicative operation for pursuing logic in a direction from an input terminal to an output terminal, and a backward implicative operation for pursuing logic in a direction from an output terminal to an input terminal.

It would be possible to determine logic of connection among fundamental logic circuits, and finally, identify a failure site by means of the above-mentioned implicative operation.

In FIG. 1, it is considered that a failure exists in a conical portion 51 obtained by repeatedly carrying out back-tracing from an output terminal through which abnormal expectation is output, to an input terminal through the use of implicative operation. It would be possible to identify an area in which a failure exists, with a higher accuracy, by defining an area 52 in which a plurality of cones defined based on failure terminals for a plurality of abnormal expectation overlap one another.

FIG. 2 shows how the failure dictionary process is carried out.

In the failure dictionary process, a failure dictionary is used. Herein, a failure dictionary is comprised of a table in which there are listed output data such as the number of terminal, logic and/or timing transmitted by logic simulation from a circuit in which degeneracy failure is defined. In the failure dictionary process, abnormal output expectation transmitted from LSI having a failure therein is compared to a failure dictionary, and if they are identical with each other, the defined degeneracy failure is judged as a failure occurring in the LSI.

The above-mentioned back-trace process is accompanied with the following problems.

First, the back-trace process can find only a logic error, and hence, it is quite difficult or almost impossible to diagnose models other than a degeneracy failure model. That is, the back-trace process is not applicable to failure modes other than a degeneracy failure model.

Second, in the back-trace process, since logic is traced back in a direction from an output terminal to an input terminal, it is impossible to define an end point. In addition, logic development in an opposite direction, that is, in a direction from an output terminal to an input terminal is increased in proportion to a square of the number of devices. Accordingly, it is not possible to converge diagnosis.

Third, the number of routes for retrieval is increased as a scale of integration in LSI is increased, and hence, it is not avoidable to extract a lot of pseudo-failure sites.

The above-mentioned failure dictionary process is accompanied with the following problems.

First, as a scale of integration in LSI is increased, data about failures to be defined would be much increased.

Second, the failure dictionary process makes it possible to find only a logic error, and hence, it is quite difficult or almost impossible to diagnose models other than a degeneracy failure model. That is, the failure dictionary process is not applicable to failure modes other than a degeneracy failure model.

Japanese Unexamined Patent Publication No. 61-155874 (A) has suggested a method of finding a failure in a large-scale integrated circuit, including the steps of setting scan paths for each of functional modules constituting the large-scale integrated circuit, selecting one of the functional modules, based on address data, inputting scan data into a scan path of the thus selected functional module, and finding a failure in the selected functional module, based on an output transmitted through the scan path of the selected functional module.

Japanese Unexamined Patent Publication No. 62-168240 (A) has suggested a scan path circuit including a scan path having flip-flops of a data processor which flip-flops are electrically connected in bit serial to one another, first means for inputting code data into the scan path which code data makes it possible to identify boundaries by which the scan path is divided in the unit of a hardware, second means for finding the code data input into the scan path through the first means, among output data transmitted from the scan path, and counting the number of finding the code data, and third means for controlling shift operation on the scan path, and instructing the first means to input the code data from the boundaries of the scan path.

Japanese Unexamined Patent Publication No. 63-169580 (A) has suggested a scan design circuit including a flip-flop constituting a scan path, a first external output terminal through which data is output from the flip-flop, and a circuit having a second external output terminal, and a switch included in the circuit. Either data to be input through a data-transmitting path or data transmitted from a particular site in the scan path is transmitted to the data-transmitting path through which data is transmitted in normal operation, through the switch.

Japanese Unexamined Patent Publication No. 2-136936 (A) has suggested a data processing system including (a) a processor having logic circuits each having first and second scan path, and a scan path circuit comprised of the first and second scan path electrically connected in series to each other, (b) a diagnostic device for controlling an operation of the scan path circuit to diagnose the data processor, (c) first and second selectors for selectively inputting output signals transmitted from the first and second scan paths, into first and second scan paths in a next stage logic circuit, and an instructor provided in the diagnostic device for instructing the first and second selectors for selection of the output signals.

Japanese Unexamined Patent Publication No. 4-30227 (A) has suggested a circuit comprised of a plurality of flip-flops electrically connected in series to one another to thereby define a scan path. A plurality of the flip-flops are electrically connected to an AND circuit and an OR circuit to thereby define an interactive path. A direction in which scanning is carried out is varied by inputting a control signal into the AND and OR circuits.

Japanese Unexamined Patent Publication No. 5-180908 (A) has suggested a logic integrated circuit including a scan path comprised of a plurality of flip-flops, a combinational circuit providing logic to the flip-flops, and a shift register for storing data therein. The shift register separately receives outputs transmitted from the flip-flops, and defines a scan path other than the above-mentioned scan path.

Japanese Unexamined Patent Publication No. 5-72272 (A) has suggested a logic circuit including a plurality of selector circuits each selecting one of first to third inputs in accordance with a control signal, and a plurality of registers associated with a plurality of the selector circuits, and receiving an output transmitted from the associated selector circuit. The selector circuits and the registers are electrically connected to one another such that when the selector circuits select the first input, the registers output a signal to be used in the logic circuit, when the selector circuits select the second input, the registers are electrically connected in series in a first direction to one another for defining a first scan path, and when the selector circuits select the third input, the registers are electrically connected in series in a second direction to one another for defining a second scan path. The first and second directions are opposite to each other.

Japanese Patent No. 2727941 (B2) (Japanese Unexamined Patent Publication No. 7-159492 (A)) has suggested a method of analyzing a failure in an integrated circuit including a plurality of flip-flops electrically connected in series to one another, a scan path for reading data out of the flip-flops in order by shift operation, and an output selector which selects and reads an output signal among output signals transmitted from the flip-flops, through an output line associated with each of the flip-flops, the method including the steps of reading data out of the scan path, reading data out of each of the flip-flops by means of the output selector, and comparing data read out of the scan path to data of he flip-flops read through the output selector, to thereby identify a failure site.

Japanese Unexamined Patent Publication No. 7-104033 (A) has suggested a method of testing LSI including a combinational circuit and N scan flip-flops. The N scan flip-flops are connected to one another such that an output Q terminal of a flip-flop is electrically connected to an input/output terminal of a next-stage flip-flop, thereby the N scan flip-flops can accomplish interactive scan operation. When a scan path circuit is in failure, data is input into LSI through the interactive input/output terminal, and then, the input data is turned inversely at each of stages of the interactive scan flip-flops. Then, the data is output to the input/output terminal to thereby detect a failure site. Then, test data is input into LSI through the interactive input/output terminal, and then, is turned inversely at an interactive scan flip-flop located prior to the failure site. Then, the test data is output to the input/output terminal. The test data is compared to expectation.

Japanese Patent No. 3104739 (B2) (Japanese Unexamined Patent Publication No. 9-281189 (A)) has suggested a LSI tester including a pattern generator having a scan path therein, a pattern comparator, a path tracer which traces back connection in a direction opposite to a direction in which signals are transmitted, based on circuit data transmitted from a first flip-flop having detected inconsistency or a first external terminal, and identifies a second flip-flop or a second external terminal to which a signal first reaches from the first flip-flop or the first external terminal, and means for varying a pattern by which inconsistency is detected, to the second flip -flop or the second external terminal.

Japanese Unexamined Patent Publication No. 11-133119 (A) has suggested an apparatus for producing test data, including a memory storing circuit data indicative of connection among logic devices, a library of logic devices, a memory storing data defining degenerate failure, a memory storing data defining conditions for carrying out scan ATPG, first means for identifying a site at which it is difficult to detect a failure, second means for identifying a site into which a failure is to be inserted, means for outputting data produced by the first and second means, and means for outputting data about a failure which is not possible to be inserted.

Japanese Unexamined Patent Publication No. 11-101859 (A) has suggested a semiconductor device including a plurality of sequence circuits by which a scan path is formed to allow a scan path test signal to pass therethrough. The semiconductor device includes a functional circuit storing or processing data, a first-stage combinational circuit located prior to the functional circuit, and receiving an output signal transmitted from a sequence circuit located prior to the functional circuit among the sequence circuits, and a switch for switching an output signal transmitted from the first-stage combinational circuit and an output signal transmitted from a combinational circuit other than the first-stage combinational circuit, based on a control signal, and outputting the selected output signal to one of the sequence circuits.

Japanese Unexamined Patent Publication No. 11-174126 (A) has suggested an apparatus for generating a pattern to be used for self-testing a logic circuit block by means of a combinational circuit. The apparatus includes a first circuit for generating a random number pattern used for testing a circuit, a first memory storing a pattern used for testing the circuit, and a selector which selects one of output signals transmitted from the first circuit and the first memory, and transmits the thus selected output signal to the circuit.

SUMMARY OF THE INVENTION

In view of the above-mentioned problems in the prior processes, it is an object of the present invention to provide a diagnostic system and a method for finding failures in an integrated circuit rapidly and accurately.

In one aspect of the present invention, there is provided a diagnostic system for finding failures in an integrated circuit including a scan-chain circuit which is comprised of a plurality of flip-flop circuits electrically connected in series to one another and outputs logic data stored in the flip-flop circuits on receipt of a control signal, the diagnostic system including (a) a first identifier which identifies a circuit group which is suspected to have failure therein, among circuit groups surrounded by the scan-chain circuit, (b) a first extractor which extracts logic data of an input terminal of the circuit group having been identified by the first identifier, (c) a second extractor which extracts logic data to be input into each of fundamental logic circuits constituting the circuit group, and (d) a second identifier which identifies a fundamental logic circuit suspected to have failure therein by comparing the logic data having been extracted by the second extractor, to one another.

It is preferable that the first identifier identifies a circuit group associated with an input which is to be input into the scan-chain circuit and was measured to have abnormal expectation, as a circuit group suspected to have failure therein, based on an output transmitted from the scan-chain circuit.

It is preferable that the first extractor extracts the logic data by virtue of logic simulation of the circuit groups surrounded by the scan-chain circuit, based on an output transmitted from the scan-chain circuit.

It is preferable that the second extractor extracts logic data equivalent to input logic in a circuit including as a minimum unit circuit groups having fundamental logic used in designing an integrated circuit.

It is preferable that the second identifier checks whether logic equivalent to input logic at a certain test vector number having logic error exists in normal-state input logic.

It is preferable that the second identifier identifies a region in which first data and second data overlaps each other, as a failure region, the first data relating to a fundamental logic circuit and being extracted by checking whether logic equivalent to input logic at a certain test vector number having logic error exists in normal-state input logic, the second data relating to a region in which a failure is suspected to exist and being extracted by tracing back logic to be input into circuit groups surrounded by the scan-chain circuit, based on output terminals of the circuit groups through which expectation error is output.

It is preferable that the second identifier identifies checks whether logic equivalent to input and output logics at a certain test vector number having logic error exist in normal-state input and output logics.

It is preferable that the second identifier identifies a region in which first data and second data overlaps each other, as a failure region, the first data relating to a fundamental logic circuit and being extracted by checking whether logic equivalent to input and output logics at a certain test vector number having logic error exist in normal-state input and output logics, the second data relating to a region in which a failure is suspected to exist and being extracted by tracing back logic to be input into circuit groups surrounded by the scan-chain circuit, based on output terminals of the circuit groups through which expectation error is output.

There is further provided a diagnostic system for diagnosing failures in an integrated circuit, the diagnostic system including a scan-chain circuit which is comprised of a plurality of flip-flop circuits electrically connected in series to one another and outputs logic data stored in the flip-flop circuits on receipt of a control signal, the diagnostic system including (a) a first unit which identifies a circuit group which is suspected to have failure therein, among circuit groups surrounded by the scan-chain circuit, (b) a second unit which extracts logic data of an input terminal of the circuit group having been identified by the first unit, and extracts logic data to be input into each of fundamental logic circuits constituting the circuit group, and (c) a third unit which identifies a fundamental logic circuit suspected to have failure therein by comparing the logic data having been extracted by the second unit, to one another, the first to third units being connected to one another through a network.

In another aspect of the present invention, there is provided a method of finding failures in an integrated circuit including a scan-chain circuit which is comprised of a plurality of flip-flop circuits electrically connected in series to one another and outputs logic data stored in the flip-flop circuits on receipt of a control signal, the method including the steps of (a) identifying a circuit group which is suspected to have failure therein, among circuit groups surrounded by the scan-chain circuit, (b) extracting logic data of an input terminal of the circuit group having been identified in the step (a), (c) extracting logic data to be input into each of fundamental logic circuits constituting the circuit group, and (d) identifying a fundamental logic circuit suspected to have failure therein by comparing the logic data having been extracted by the second extractor, to one another.

It is preferable that a circuit group associated with an input which is to be input into the scan-chain circuit and was measured to have abnormal expectation is identified in the step (a) as a circuit group suspected to have failure therein, based on an output transmitted from the scan-chain circuit.

It is preferable that the logic data is extracted in the step (b) by virtue of logic simulation of the circuit groups surrounded by the scan-chain circuit, based on an output transmitted from the scan-chain circuit.

It is preferable that logic data equivalent to input logic in a circuit including as a minimum unit circuit groups having fundamental logic used in designing an integrated circuit is extracted in the step (c).

It is preferable that it is checked in the step (d) whether logic equivalent to input logic at a certain test vector number having logic error exists in normal-state input logic.

It is preferable that a region in which first data and second data overlaps each other is identified as a failure region in the step (d), the first data relating to a fundamental logic circuit and being extracted by checking whether logic equivalent to input logic at a certain test vector number having logic error exists in normal-state input logic, the second data relating to a region in which a failure is suspected to exist and being extracted by tracing back logic to be input into circuit groups surrounded by the scan-chain circuit, based on output terminals of the circuit groups through which expectation error is output.

It is preferable that it is checked in the step (d) whether logic equivalent to input and output logics at a certain test vector number having logic error exist in normal-state input and output logics.

It is preferable that a region in which first data and second data overlaps each other is identified as a failure region in the step (d), the first data relating to a fundamental logic circuit and being extracted by checking whether logic equivalent to input and output logics at a certain test vector number having logic error exist in normal-state input and output logics, the second data relating to a region in which a failure is suspected to exist and being extracted by tracing back logic to be input into circuit groups surrounded by the scan-chain circuit, based on output terminals of the circuit groups through which expectation error is output.

The advantages obtained by the aforementioned present invention will be described hereinbelow.

In accordance with the present invention, a circuit group suspected to have a failure therein is first identified among a plurality of circuit groups surrounded by a scan-chain circuit. Then, logic data is extracted out of the thus identified circuit group, logic data to be input into fundamental logic circuits constituting the circuit group is extracted, and logic data of the fundamental logic circuits are compared to one another, thereby a fundamental logic circuit suspected to have a failure therein is identified. Thus, it is possible to rapidly and accurately identify a failure in a circuit.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 10A shows an input logic table of a block having five inputs.

FIG. 10B shows an input logic table of a block having five inputs.

DESCRIPTION OF THE PREFERRED EMBODIMENTS

Preferred embodiments in accordance with the present invention will be explained hereinbelow with reference to drawings.

Hereinbelow is explained a diagnostic system in accordance with an embodiment of the present invention.

Since a large-scale integrated circuit (LSI) has been fabricated in a larger scale and designed to have a greater number of functions, a test as to whether LSI works properly needs quite high costs. In particular, in a test of LSI required to have high quality, a test coverage has to be equal to or greater than 90%. Herein a test coverage is defined as a ratio of circuits to be tested among all of circuits.

Under the above-mentioned condition, there has been widely carried out a test in which a sequence circuit called a scan-chain, which will be explained later, is tested as if the sequence circuit constitutes a combinational circuit, in order to effectively test LSIs.

A scan-chain design means design for testability (DFT) for effectively testing logic circuits constituting LSI. In the scan-chain design, all flip-flops existing in LSI are electrically connected in order in a chain to thereby enhance controllability and observability of internal logic.

Hereinbelow is explained scanning operation.

Figure 1:
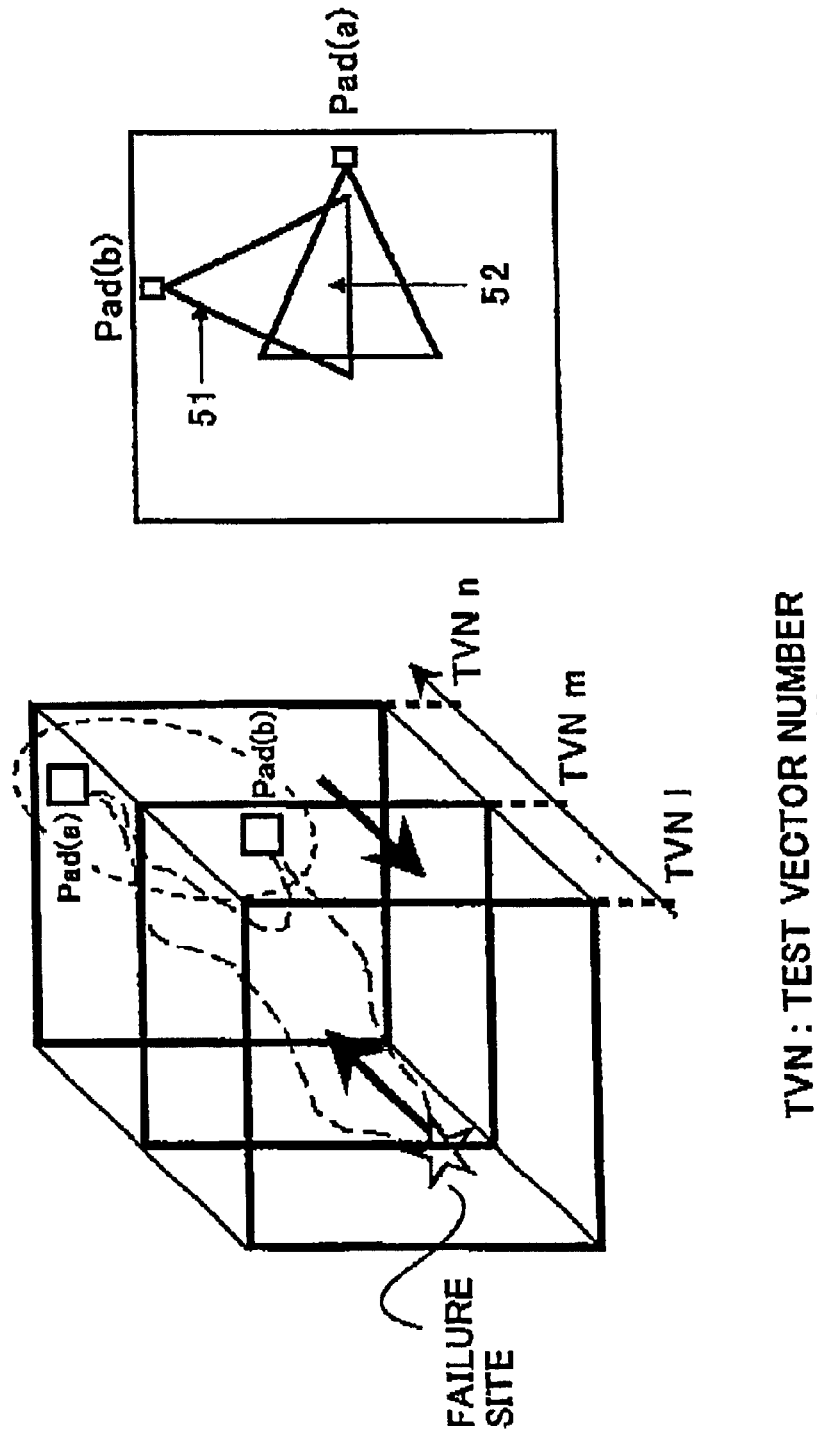
FIG. 1 shows how the back-trace process is carried out.
Figure 2:
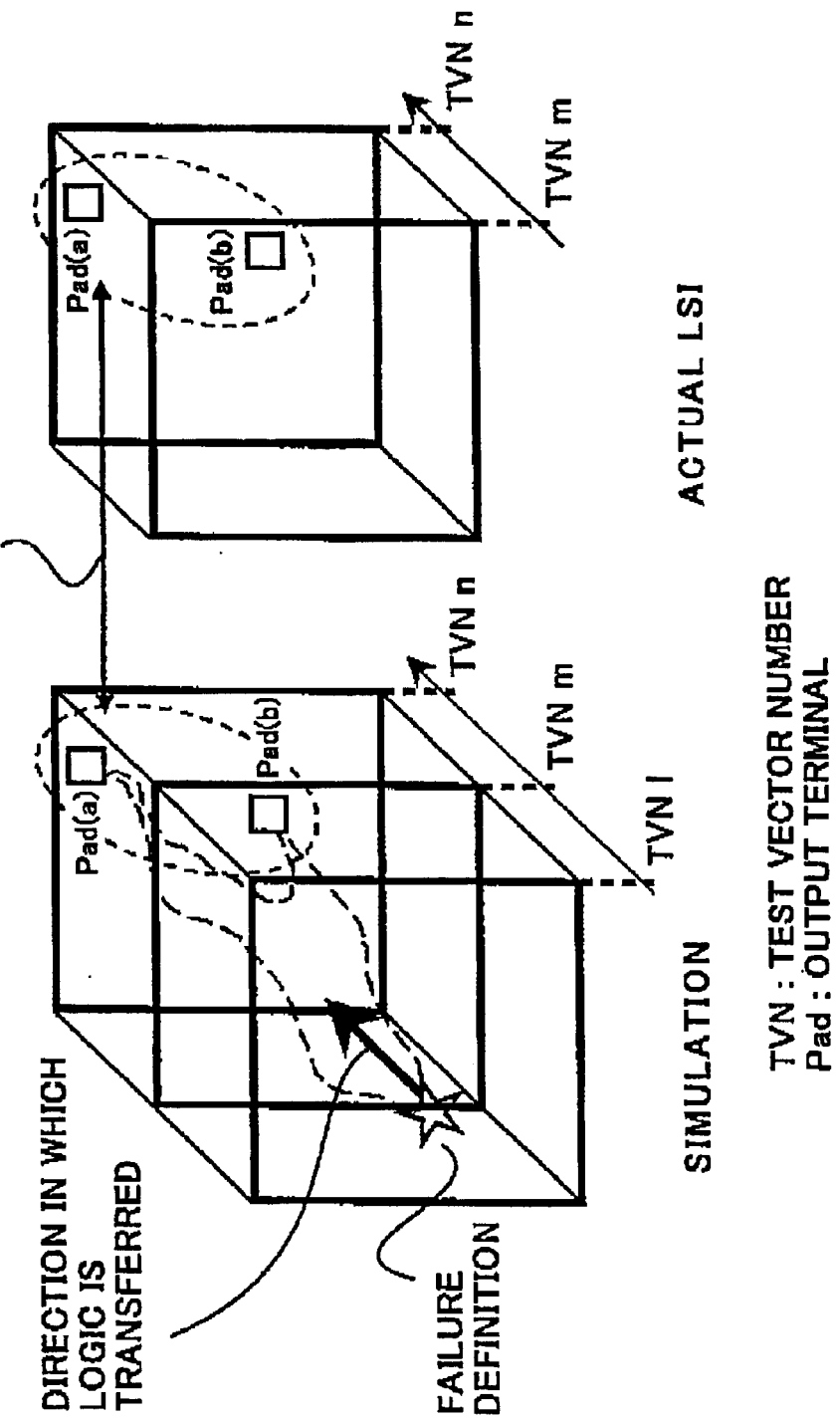
FIG. 2 shows how the failure dictionary process is carried out.
Figure 3:
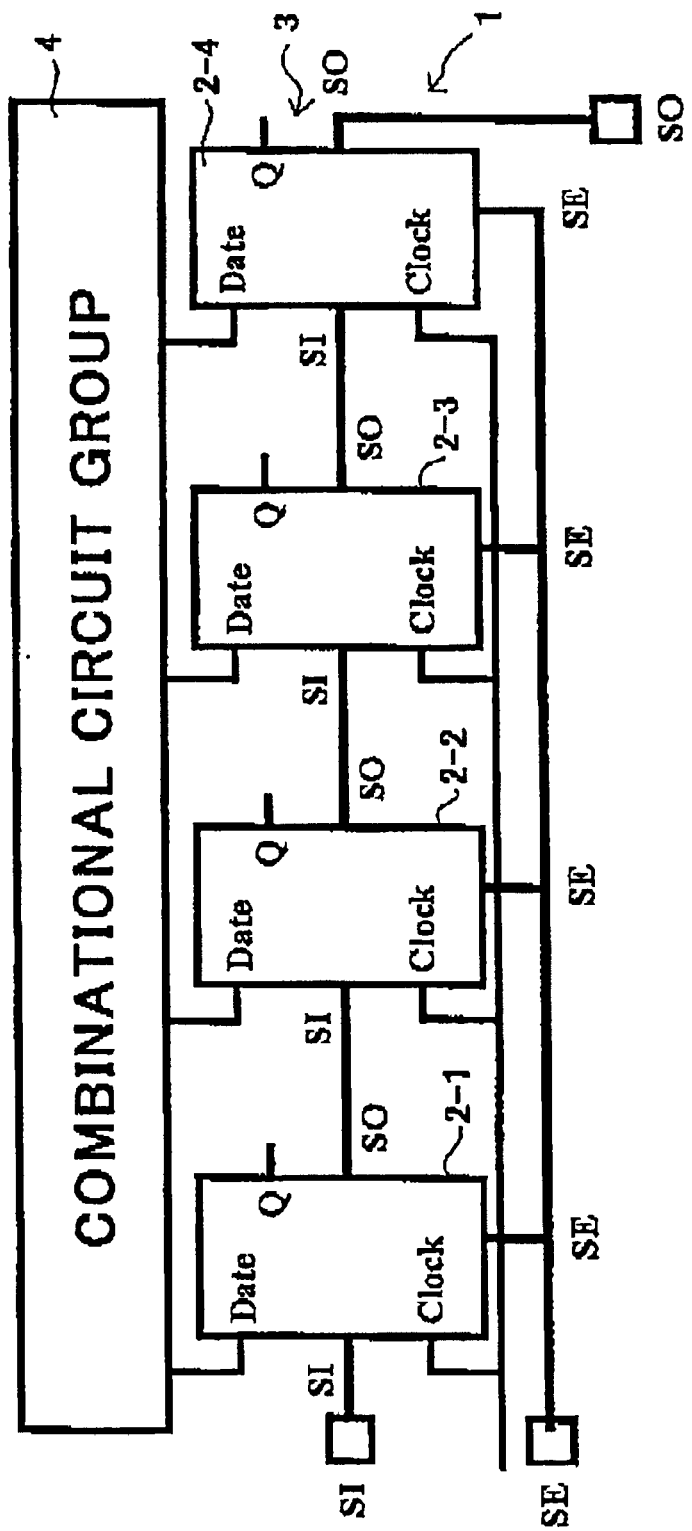
FIG. 3 is a block diagram of a circuit carrying out scanning operation.

FIG. 3 illustrates a scan-chain circuit 1 comprised of a flip-flop group 3 including first to fourth flip-flops 2-1 to 2-4, and a combinational circuit group 4 constituting an immediately prior stage to the flip-flop group 3.

Each of the first to fourth flip-flops 2-1 and 2-4 in the flip-flop group 3 is designed to have three terminals, that is, a scan-in terminal SI, a scan-out terminal SO and a scan-enable terminal SE, for carrying out scanning operation.

It is possible to check whether a logic of the scan-chain circuit 1 is proper or not by activating the scan-enable terminal SE, for instance, by inputting a high level signal into the scan-enable terminal SE. On the other hand, by inputting a low level signal into the scan-enable terminal SE, it is possible to check a date or an output logic transmitted from the combinational circuit group 4 and input into each of the first to fourth flip-flops 2-1 to 2-4 of the scan-chain circuit 1. By virtue of such performances of the scan-chain circuit 1 as mentioned above, it is possible to diagnose the combinational circuit group 4 surrounded by the scan-chain circuit 1.

Figure 4:
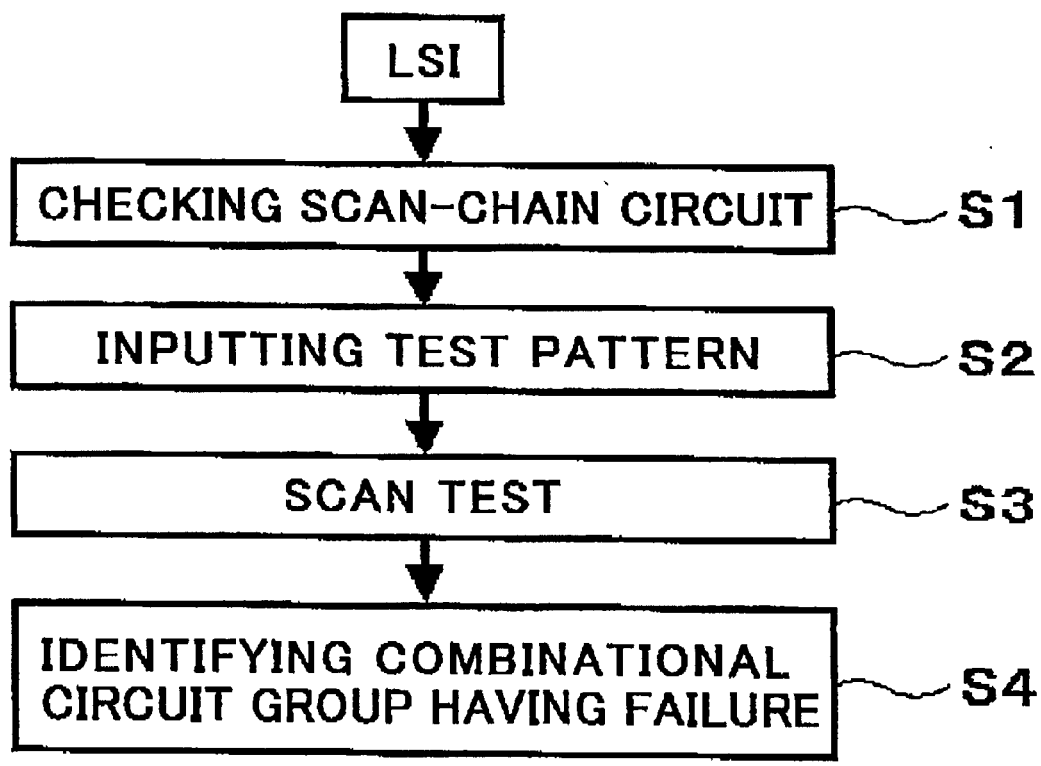
FIG. 4 is a flow chart of a method of finding a failure in an integrated circuit.
Figure 5:
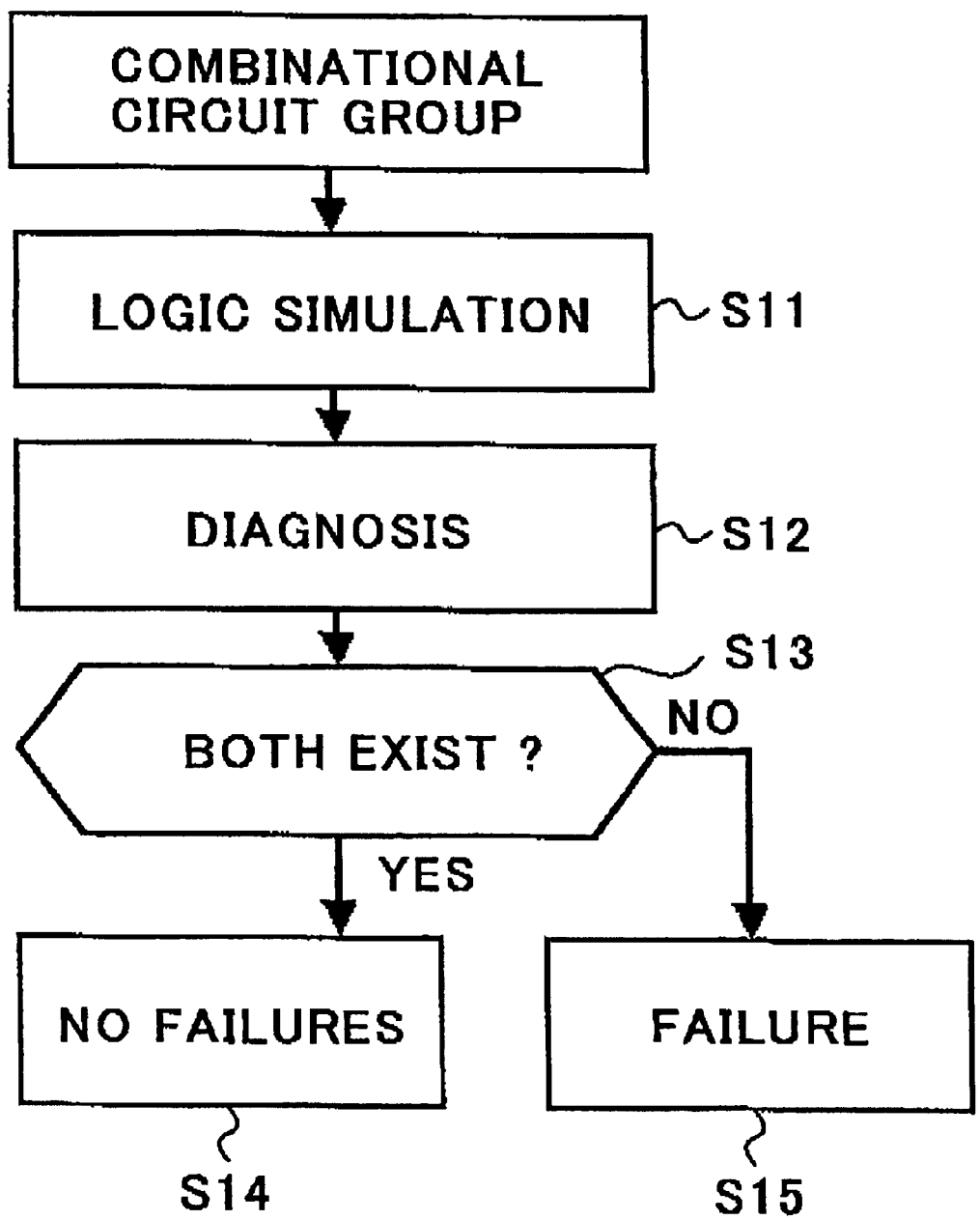
FIG. 5 is a flow chart of a method of finding a failure in an integrated circuit.

FIGS. 4 and 5 are flow charts of a process of diagnosing an integrated circuit, that is, finding a failure in an integrated circuit.

First, the scan-chain circuit 1 is checked as to whether the scan-chain circuit 1 properly carries out scanning operation, in step S1 in FIG. 4.

Then, a test pattern is input into an input terminal 22 of LSI (see FIG. 7), in step S2 in FIG. 4.

Then, a scan test is carried out, in step S3 in FIG. 4. Specifically, an output measured by the scan-chain circuit 1 for each of test vector numbers is compared to an expectation value.

Then, a combinational circuit group 4 having failure therein is identified, in step S4 in FIG. 4.

Then, logic simulation is carried out for each of fundamental logic circuits, in step S11 in FIG. 5. Specifically, logic is extracted out of each of fundamental logic circuits.

Then, each of the fundamental logic circuits is diagnosed in step S12 in FIG. 5.

Then, it is checked whether both logic having an error therein and logic in normal condition exist or not, in step S13.

If it is judged that both of them exist together (YES in step S13), it is judged that an integrated circuit under test includes no failures, in step S14.

If it is judged that neither of them exists (NO in step S13), it is judged that an integrated circuit under test includes a failure, in step S15.

When abnormal expectation is found in the scan-chain circuit 1, it is possible to determine which output is abnormal among outputs transmitted from the flip-flop groups 3, based on an order of the scan-chain circuit 1. As a result, it is possible to judge that there is a failure in the combinational circuit group 4 surrounded by both the thus identified flip-flop group 3 and a flip-flop group arranged just prior to the flip-flop group 3.

Then, logic data associated with test vector numbers (TVN) are extracted out of each of the fundamental logic circuits constituting the combinational circuit group 4 which has been identified as having a failure therein. Thus, it is possible to identify a fundamental logic circuit having a failure therein.

As mentioned above, logic data associated with test vector numbers (TVN) is extracted out of each of fundamental logic circuits constituting LSI. Then, the combinational circuit group 4 suspected to have a failure therein is identified. Then, all of the fundamental logic circuits constituting the thus identified combinational circuit group 4 are diagnosed by virtue of logic data of the thus identified combinational circuit group 4. Thus, it is possible to identify a fundamental logic circuit suspected to have a failure therein.

Figure 6:
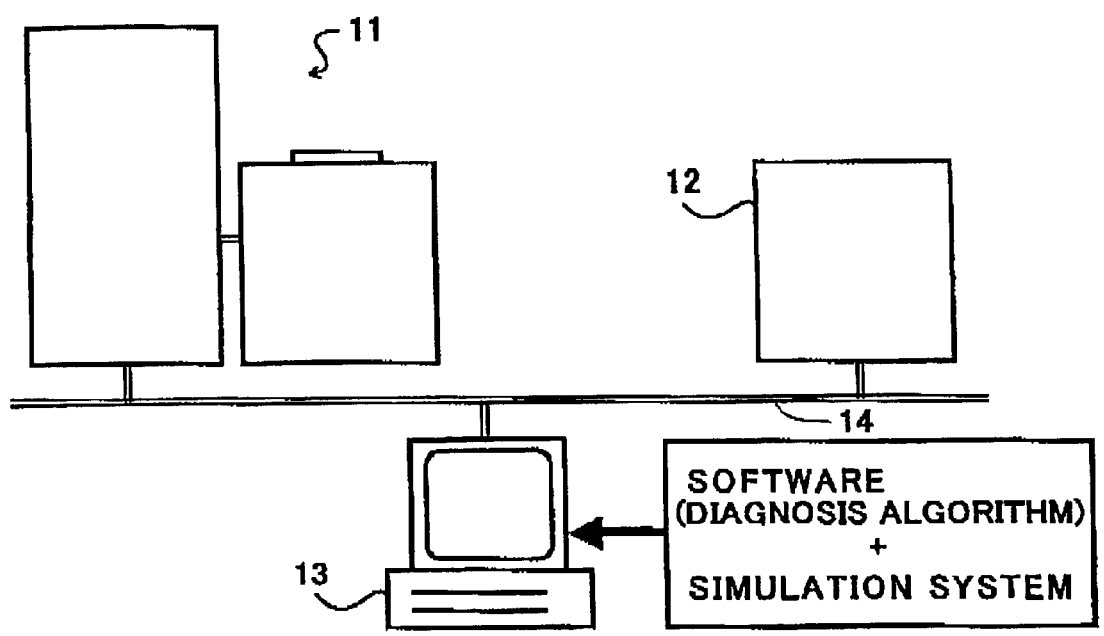
FIG. 6 is a block diagram of a diagnostic system to which the present invention is applied.

FIG. 6 is a block diagram of a diagnostic system in accordance with an embodiment of the present invention.

As illustrated in FIG. 6, the diagnostic system is comprised of a test system 11 such as a LSI tester a CAD data processing system 12 through which LSI is designed, and a processor 13 in which a software having diagnosis algorithm is stored and which receives data from the test system 11 and the CAD data processing system 12, and then, carries out diagnosis.

For instance, the processor 13 may be comprised of a personal computer (PC) or an engineering work station (EWS).

The test system 11, the CAD data processing system 12 and the processor 13 are designed to be communicated to one another through a network 14.

Figure 7:
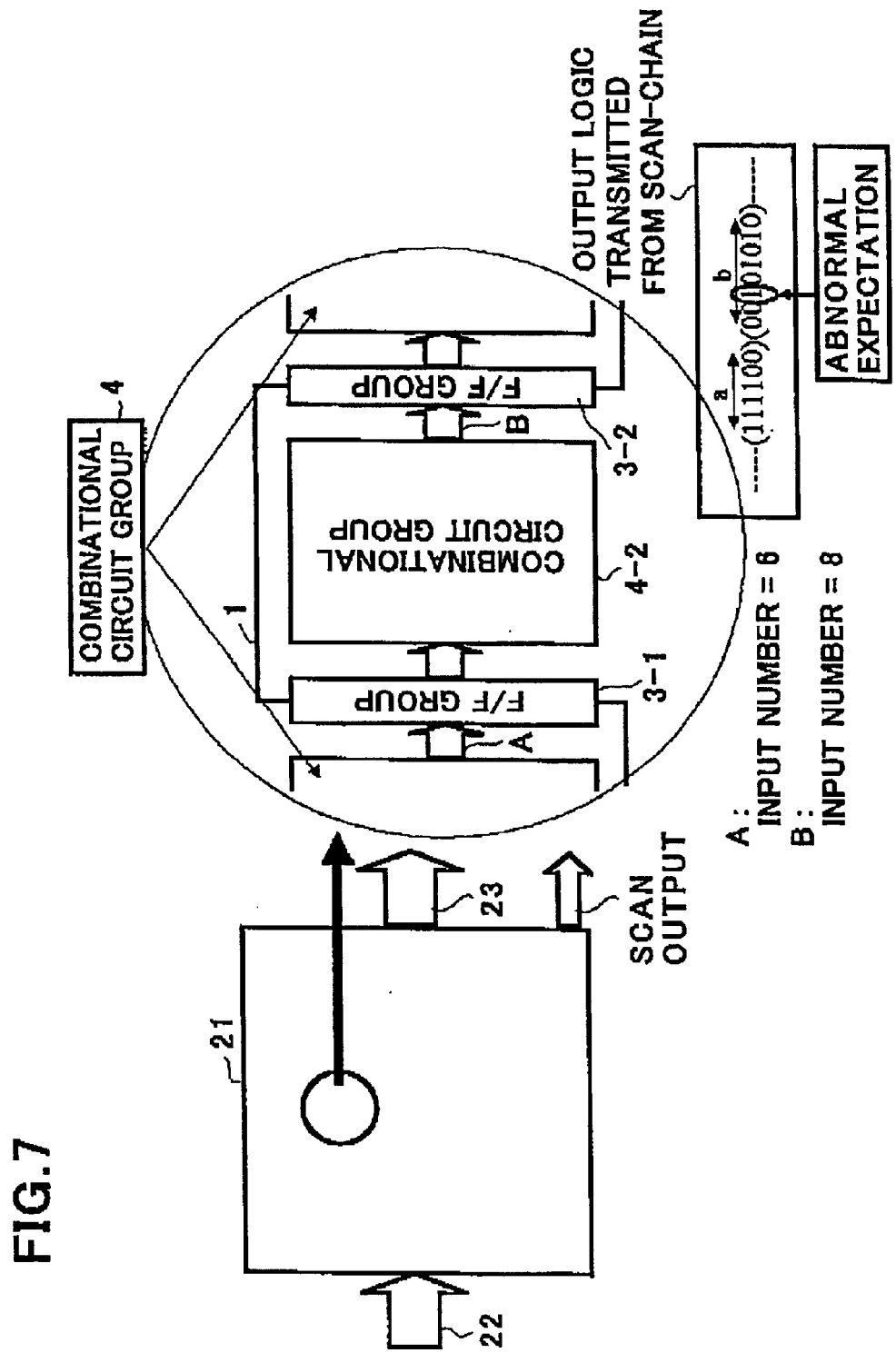
FIG. 7 is a block diagram of a circuit group surrounded by scan-chain circuits.

FIG. 7 is a block diagram of a combinational circuit group 4 surrounded by the scan-chain circuits 1.

Hereinbelow is explained a method of identifying a combinational circuit group 4 surrounded by the scan-chain circuit 1 and having a logic error, with reference to FIGS. 4 and 7.

An object to be diagnosed is the combinational circuit group 4 situated just prior to the scan-chain circuit 1 in which logic error was detected. The combinational circuit group 4 is diagnosed to be suspected to have a failure therein. This is because logic observed by the scan-chain circuit 1 reflects an output logic transmitted from the combinational logic circuit 4 situated just prior to the scan-chain circuit 1.

Before a logic of the scan-chain circuit 1 in LSI 21 is checked, the scan-chain circuit 1 is checked as to whether it has a failure or not, in step S1 in FIG. 4.

If it is confirmed that the scan-chain circuit 1 has no failures, a logic is input into LSI 22 through the input terminal 21, in step S2 in FIG. 4.

Then, logic operation in LSI 21 is tested, in step S3 in FIG. 4.

Herein, it is assumed that there is detected expectation error during the logic operation in output logic transmitted from the scan-chain circuit 1 in response to input logic input into LSI 21 through the input terminal 22. Output logic transmitted from the scan-chain circuit 1 is equivalent to output logic transmitted from the combinational circuit group 4 situated just prior to the scan-chain circuit 1. In FIG. 7, output logic transmitted from a first flip-flop group 3-1 is equivalent to output logic transmitted from a combinational circuit group 4-1, and output logic transmitted from a second flip-flop group 3-2 is equivalent to output logic transmitted from a combinational circuit group 4-2.

It is assumed that the results of checking a logic of the scan-chain circuit 1 show that, among outputs transmitted from the scan-chain circuit 1, a logical value (111100) corresponding to an output transmitted from the first flip-flop group 3-1 has no failures, but a logical value (00101010) corresponding to an output transmitted from a second flip-flop group 3-2 is not identical with an expected value (00001010). Under this assumption, it is found out that a combinational circuit group 4-2 having an output terminal through which the logical value (00101010) has been transmitted has a failure therein, in step S4 in FIG. 4.

Then, the combinational circuit group 4-2 is diagnosed, based on the thus obtained data.

First, data about the input terminal of the combinational circuit group 4-2 is extracted, in step S11 in FIG. 5.

Logic of fundamental logic circuits constituting the combinational circuit group 4-2 can be identified by logic simulation. Data necessary for diagnosing the combinational circuit group 4-2 can be identified based on data about expected values transmitted from the scan-chain circuit 1. That is, data about logic of an internal block can be extracted by logic simulation, as if attention is paid only to input and output logics of the combinational circuit group 4-2.

Figure 8:
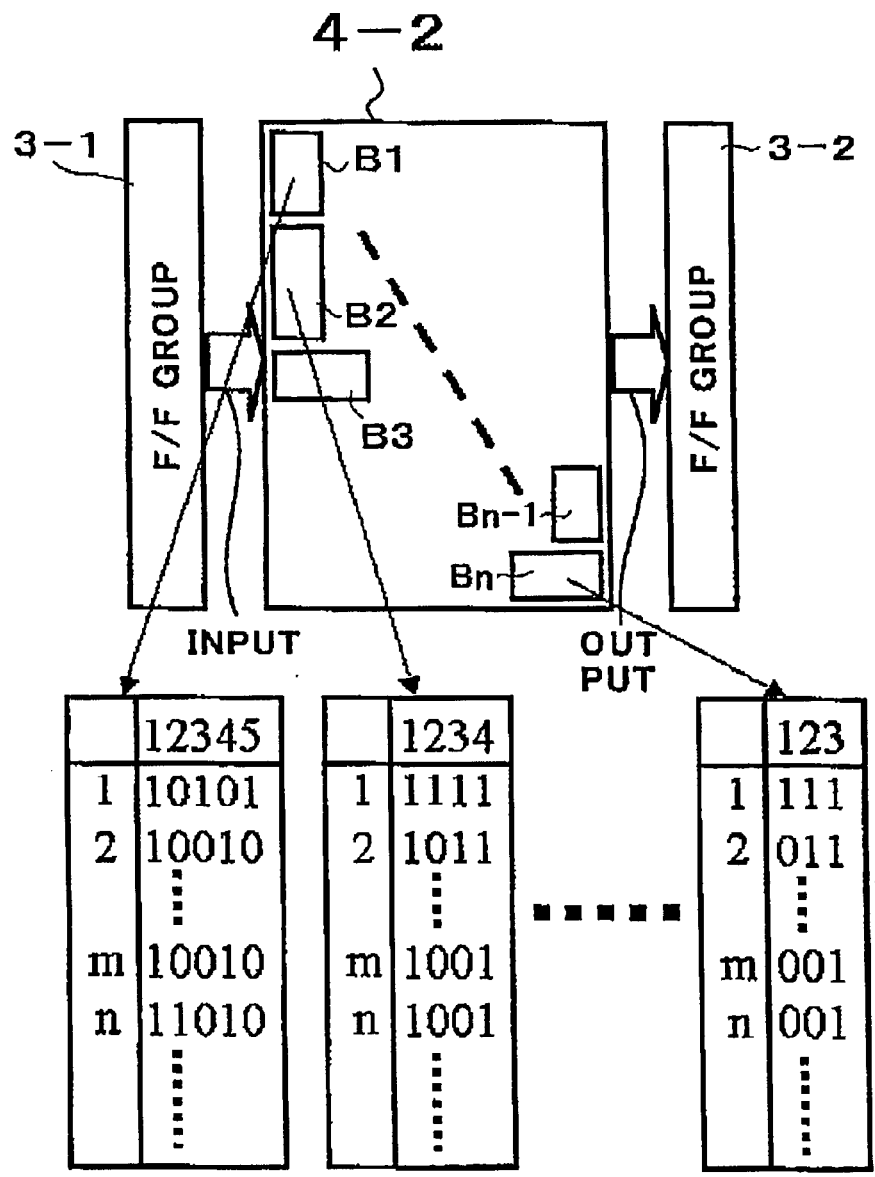
FIG. 8 shows an input logic table in association with a test vector number (TVN) of each of fundamental logic circuits constituting a circuit group.

FIG. 8 shows an input logic table associated with test vector numbers (TVN) of each of blocks in the combinational circuit group 4-2 comprised of N fundamental logic blocks B1 to Bn.

For instance, a block B1 which is a fundamental logic circuit having five inputs shows an input logic table storing therein input logics arranged in accordance with an order of test vector numbers (TVN), and associated with test vectors input through the input terminal 22 of LSI 21. The block B1 can be identified by logic simulation.

Then, logic data of fundamental logic circuits constituting the combinational circuit group 4 is extracted.

Logic data of fundamental logic circuits associated with test vector numbers (TVN) is extracted by logic simulation. Input and output logics of each of the fundamental logic circuits are extracted. The combinational circuit group 4-2 is diagnosed based on a combination of the thus extracted input and output logics, in step S12 in FIG. 5.

In the combinational circuit group 4, generally only one internal logic is determined in association with input logic, and accordingly, it is possible to diagnose the combinational circuit group 4 only by input logic data.

Figure 9:
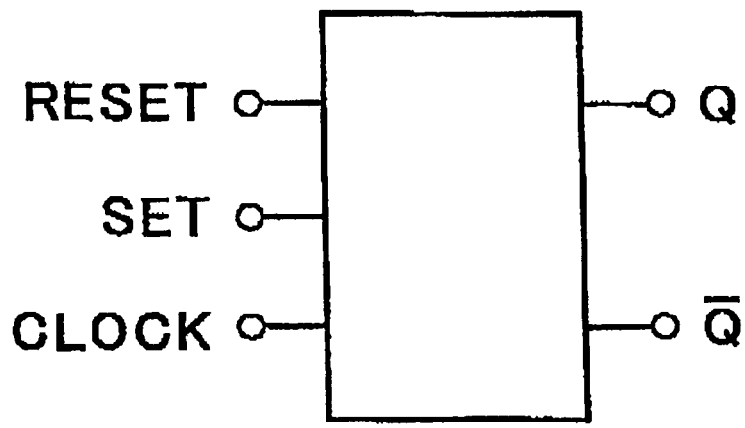
FIG. 9 illustrates an example of a toggle circuit using input and output logic as diagnostic data.

However, as illustrated in FIG. 9, a circuit such as a toggle circuit having setting and resetting functions which toggle circuit is a part of the combinational circuit group 4 and has no input terminal through which data is input thereinto inverts logic per a period of a clock signal, and outputs the thus inverted logic. Accordingly, if the combinational circuit group 4 is diagnosed only based on input logic data, wrong diagnosis would be carried out. Accordingly, proper diagnosis would be carried out for such a circuit as the toggle circuit illustrated in FIG. 9 by using both of input logic data and output logic data.

Then, a block having a failure therein is identified by comparing logics of blocks to one another, in step S13 in FIG. 5.

In the comparison, it is checked whether a logic identical with an input logic in which a logic error has been detected exists in a normal condition for each of blocks. This is quite effective, because the combinational circuit group 4-2 obviously has a logic error therein.

Only one internal logic of the combinational circuit group 4 surrounded by the scan-chain circuits 1 can be determined in association with input logic of the combinational circuit group 4.

FIGS. 10A and 10B illustrate input logic tables of an arbitrary block having five inputs.

Hereinbelow is explained a process of judging whether a block has a failure therein.

FIG. 10A shows that TVN (m+2) and TVN (n) both having a logic error have input logic (11100), and other TVNs do not have the same logic as the input logic (11100) of TVN (m+2) and TVN (n). Accordingly, it is judged that the block illustrated in FIG. 10A may have a failure, in steps S15 in FIG. 5.

This is because the combinational circuit group 4 has only one internal state which is determined in accordance with input logic. If the combinational circuit group 4 receives a common input logic, but sometimes transmits logic error and sometimes transmits normal logic, it is against the above-mentioned theory that input logic of blocks constituting the combinational circuit group 4 determines only one internal state.

FIG. 10B shows that though TVN (m+2) and TVN (n) have the same input logic (11100), TVN (m+2) has logic error, but TVN (n) has normal logic. Under such input logics as illustrated in FIG. 10B, it is judged that the block illustrated in FIG. 10B does not have a failure, in steps S14 in FIG. 5.

This is because the combinational circuit group 4 has only one internal state which is determined in accordance with input logic, and hence, if the combinational circuit group 4 receives the same input logic, it cannot occur that the combinational circuit group 4 outputs logic error at a certain TVN and the combinational circuit group 4 outputs normal logic at other TVN.

Hereinbelow is explained various cases to which the diagnostic system in accordance with the above-mentioned embodiment is applied.

First, a process of diagnosing a high-rate operation failure is explained hereinbelow.

Figure 11:
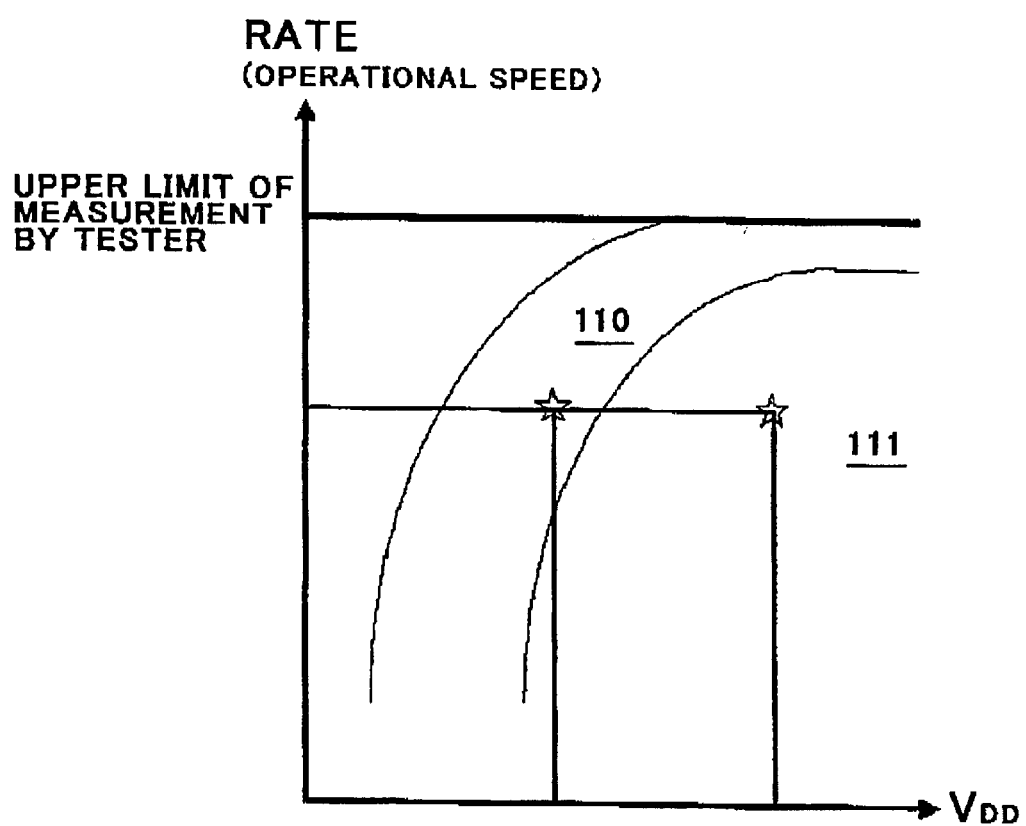
FIG. 11 is a map showing an operation of LSI.

FIG. 11 is a map showing an operation of LSI 21. In FIG. 21, an axis of ordinate indicates a rate or operational speed, and an abscissa indicates a voltage of a power supply (VDD).

As illustrated in FIG. 11, an operational region 110 for LSI having no failures is quite different from an operational region 111 for LSI having a failure. The former covers almost all of VDD, whereas the latter shifts towards to the right, that is, towards a region where VDD is high.

LSI having a failure with respect to high-rate operation can be diagnosed by testing the LSI at an operational speed and VDD at which the LSI is judged to have logic error, and detecting a failure site transmitted from the scan-chain circuit 1.

Second, a process of finding a failure with high accuracy is explained hereinbelow.

The process may be combined with the above-mentioned back-trace process in order to accomplish diagnosis with high accuracy. The above-mentioned conventional back-trace process makes it possible to identify a site suspected to have a failure therein. It would be possible to identify a site suspected to have a failure, with high accuracy, by determining an area at which the site identified by the back-trace process and a site identified by the present process overlap each other.

The present process makes it possible to identify a failure site without depending on a failure mode, if a failure is output as a logic error in synchronization with a test vector. That is, if a signal caused by a failure can reach an output terminal and the failure can be detected, it would be possible to identify a failure site without relying on a failure mode.

The diagnostic system in accordance with the above-mentioned embodiment provides the following advantages.

The first advantage is that it is possible to significantly reduce a time necessary for carrying out diagnosis. This is because, since each of fundamental logic circuits can be diagnosed independently of each other, a plurality of fundamental logic circuits can be diagnosed in parallel.

The second advantage is that it is possible to diagnose all failures which will cause logic errors.

The third advantage is that a large-scale integrated circuit can be diagnosed through the use of a scan-chain circuit.

The fourth advantage is that a diagnosis algorithm can be simplified, because only a combinational circuit is diagnosed by the present invention.

The fifth advantage is that it is possible to judge that a block located closest to an input has a failure therein with highest probability among a plurality of blocks suspected to have a failure therein.

The sixth advantage is that what has to be diagnosed is merely a partial circuit, it is no longer necessary to diagnose LSI in its entirety.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-273546 filed on Sep. 10, 2001 including specification, claims, drawings and summary is incorporated herein by reference in its entirety.

What is claimed is:

1. A diagnostic system for finding failures in an integrated circuit including a scan-chain circuit which is comprised of a plurality of flip-flop circuits electrically connected in series to one another and outputs logic data stored in said flip-flop circuits on receipt of a control signal,
said diagnostic system including:
(a) a first identifier which identifies a circuit group which is suspected to have failure therein, among circuit groups surrounded by said scan-chain circuit;
(b) a first extractor which extracts logic data of an input terminal of said circuit group having been identified by said first identifier;
(c) a second extractor which extracts logic data to be input into each of fundamental logic circuits constituting said circuit group; and
(d) a second identifier which identifies a fundamental logic circuit suspected to have failure therein by comparing said logic data having been extracted by said second extractor, to one another.

2. The diagnostic system as set forth in claim 1, wherein said first identifier identifies a circuit group associated with an input which is to be input into said scan-chain circuit and was measured to have abnormal expectation, as a circuit group suspected to have failure therein, based on an output transmitted from said scan-chain circuit.

3. The diagnostic system as set forth in claim 1, wherein said first extractor extracts said logic data by virtue of logic simulation of said circuit groups surrounded by said scan-chain circuit, based on an output transmitted from said scan-chain circuit.

4. The diagnostic system as set forth in claim 1, wherein said second extractor extracts logic data equivalent to input logic in a circuit including as a minimum unit circuit groups having fundamental logic used in designing an integrated circuit.

5. The diagnostic system as set forth in claim 1, wherein said second identifier checks whether logic equivalent to input logic at a certain test vector number having logic error exists in normal-state input logic.

6. The diagnostic system as set forth in claim 1, wherein said second identifier identifies a region in which first data and second data overlaps each other, as a failure region, said first data relating to a fundamental logic circuit and being extracted by checking whether logic equivalent to input logic at a certain test vector number having logic error exists in normal-state input logic, said second data relating to a region in which a failure is suspected to exist and being extracted by tracing back logic to be input into circuit groups surrounded by said scan-chain circuit, based on output terminals of said circuit groups through which expectation error is output.

7. The diagnostic system as set forth in claim 1, wherein said second identifier identifies checks whether logic equivalent to input and output logics at a certain test vector number having logic error exist in normal-state input and output logics.

8. The diagnostic system as set forth in claim 1, wherein said second identifier identifies a region in which first data and second data overlaps each other, as a failure region, said first data relating to a fundamental logic circuit and being extracted by checking whether logic equivalent to input and output logics at a certain test vector number having logic error exist in normal-state input and output logics, said second data relating to a region in which a failure is suspected to exist and being extracted by tracing back logic to be input into circuit groups surrounded by said scan-chain circuit, based on output terminals of said circuit groups through which expectation error is output.

9. A diagnostic system for diagnosing failures in an integrated circuit, said diagnostic system including a scan-chain circuit which is comprised of a plurality of flip-flop circuits electrically connected in series to one another and outputs logic data stored in said flip-flop circuits on receipt of a control signal, said diagnostic system including:

(a) a first unit which identifies a circuit group which is suspected to have failure therein, among circuit groups surrounded by said scan-chain circuit;

(b) a second unit which extracts logic data of an input terminal of said circuit group having been identified by said first unit, and extracts logic data to be input into each of fundamental logic circuits constituting said circuit group; and (c) a third unit which identifies a fundamental logic circuit suspected to have failure therein by comparing said logic data having been extracted by said second unit, to one another, said first to third units being connected to one another through a network.

10. A method of finding failures in an integrated circuit including a scan-chain circuit which is comprised of a plurality of flip-flop circuits electrically connected in series to one another and outputs logic data stored in said flip-flop circuits on receipt of a control signal, said method including the steps of:

(a) identifying a circuit group which is suspected to have failure therein, among circuit groups surrounded by said scan-chain circuit;

(b) extracting logic data of an input terminal of said circuit group having been identified in said step (a);

(c) extracting logic data to be input into each of fundamental logic circuits constituting said circuit group; and (d) identifying a fundamental logic circuit suspected to have failure therein by comparing said logic data having been extracted in said stop (c) to one another.

11. The method as set forth in claim 10, wherein a circuit group associated with an input which is to be input into said scan-chain circuit and was measured to have abnormal expectation is identified in said step (a) as a circuit group suspected to have failure therein, based on an output transmitted from said scan-chain circuit.

12. The method as set forth in claim 10, wherein said logic data is extracted in said step (b) by virtue of logic simulation of said circuit groups surrounded by said scan-chain circuit, based on an output transmitted from said scan-chain circuit.

13. The method as set forth in claim 10, wherein logic data equivalent to input logic in a circuit including as a minimum unit circuit groups having fundamental logic used in designing an integrated circuit is extracted in said step (c).

14. The method as set forth in claim 10, wherein it is checked in said step (d) whether logic equivalent to input logic at a certain test vector number having logic error exists in normal-state input logic.

15. The method as set forth in claim 10, wherein a region in which first data and second data overlaps each other is identified as a failure region in said step (d), said first data relating to a fundamental logic circuit and being extracted by checking whether logic equivalent to input logic at a certain test vector number having logic error exists in normal-state input logic, said second data relating to a region in which a failure is suspected to exist and being extracted by tracing back logic to be input into circuit groups surrounded by said scan-chain circuit, based on output terminals of said circuit groups through which expectation error is output.

16. The method as set forth in claim 10, wherein it is checked in said step (d) whether logic equivalent to input and output logics at a certain test vector number having logic error exist in normal-state input and output logics.

17. The method as set forth in claim 10, wherein a region in which first data and second data overlaps each other is identified as a failure region in said step (d), said first data relating to a fundamental logic circuit and being extracted by checking whether logic equivalent to input and output logics at a certain test vector number having logic error exist in normal-state input and output logics, said second data relating to a region in which a failure is suspected to exist and being extracted by tracing back logic to be input into circuit groups surrounded by said scan-chain circuit, based on output terminals of said circuit groups through which expectation error is output.

* * * * *